(12) United States Patent
Yamaguchi

(10) Patent No.: US 7,227,263 B2
(45) Date of Patent: Jun. 5, 2007

(54) SEMICONDUCTOR DEVICE WITH RECESSED POST ELECTRODE

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/995,411

(22) Filed: Nov. 24, 2004

(65) Prior Publication Data

US 2005/0205993 A1 Sep. 22, 2005

(30) Foreign Application Priority Data

Mar. 19, 2004 (JP) .............................. 2004-081491

(51) Int. Cl.
H01L 23/48 (2006.01)
H01L 23/52 (2006.01)
H01L 29/40 (2006.01)

(52) U.S. Cl. ............... 257/738; 257/737; 257/E21.058; 257/E23.021

(58) Field of Classification Search ........ 257/737–738, 257/E23.021, E21.508
See application file for complete search history.

(56) References Cited

U.S. PATENT DOCUMENTS

| | | | |
|---|---|---|---|
| 6,337,445 B1 * | 1/2002 | Abbott et al. ............... | 174/260 |
| 6,404,051 B1 * | 6/2002 | Ezawa et al. ............... | 257/734 |
| 6,642,626 B2 * | 11/2003 | Park ........................... | 257/778 |
| 6,734,568 B2 * | 5/2004 | Matsuo et al. .............. | 257/781 |
| 6,793,116 B2 * | 9/2004 | Harada ....................... | 228/56.3 |
| 2003/0052409 A1 * | 3/2003 | Matsuo et al. .............. | 257/737 |
| 2003/0052414 A1 * | 3/2003 | Cowens et al. ............. | 257/778 |
| 2004/0201097 A1 * | 10/2004 | Ohsumi ...................... | 257/737 |
| 2004/0238955 A1 * | 12/2004 | Homma et al. ............. | 257/737 |
| 2005/0017356 A1 * | 1/2005 | Ohsumi ...................... | 257/738 |
| 2005/0073049 A1 * | 4/2005 | Tsubosaki ................... | 257/738 |
| 2005/0093149 A1 * | 5/2005 | Nakatani .................... | 257/737 |
| 2005/0098891 A1 * | 5/2005 | Wakabayashi et al. ...... | 257/758 |

FOREIGN PATENT DOCUMENTS

| | | |
|---|---|---|
| JP | 2000-228455 | 8/2000 |
| JP | 3217046 | 8/2001 |
| JP | 2002-170427 | 6/2002 |

* cited by examiner

*Primary Examiner*—Kenneth Parker
*Assistant Examiner*—Jesse A. Fenty
(74) *Attorney, Agent, or Firm*—Volentine & Whitt, P.L.L.C.

(57) ABSTRACT

A semiconductor device includes a semiconductor chip which has a top surface, a conductive member which includes a first portion which is located on the electrode pad and a second portion which is extended from the first portion, and a sealing resin which seals the top surface of the semiconductor chip and the conductive member. A top surface of the second portion is exposed from the sealing resin and a part of the top surface of the second portion is concaved from a surface of the sealing resin. An external electrode is formed on the top surface of the second portion.

9 Claims, 17 Drawing Sheets

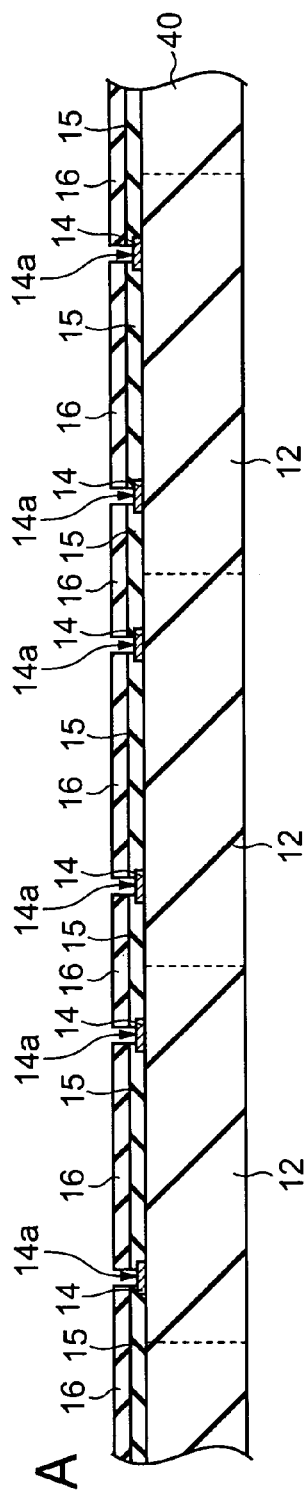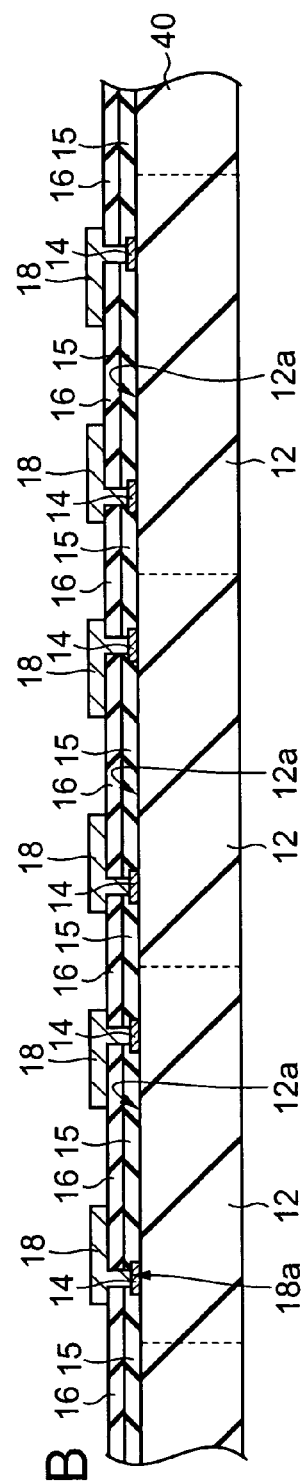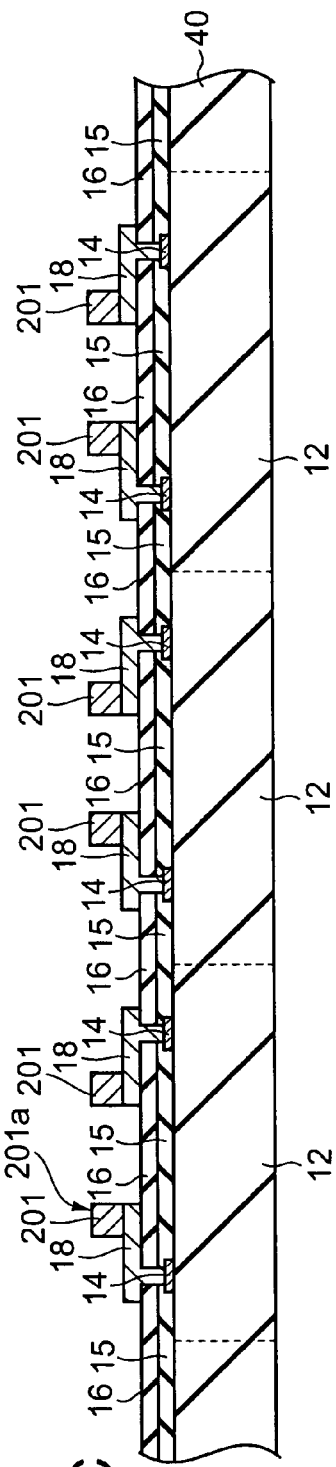

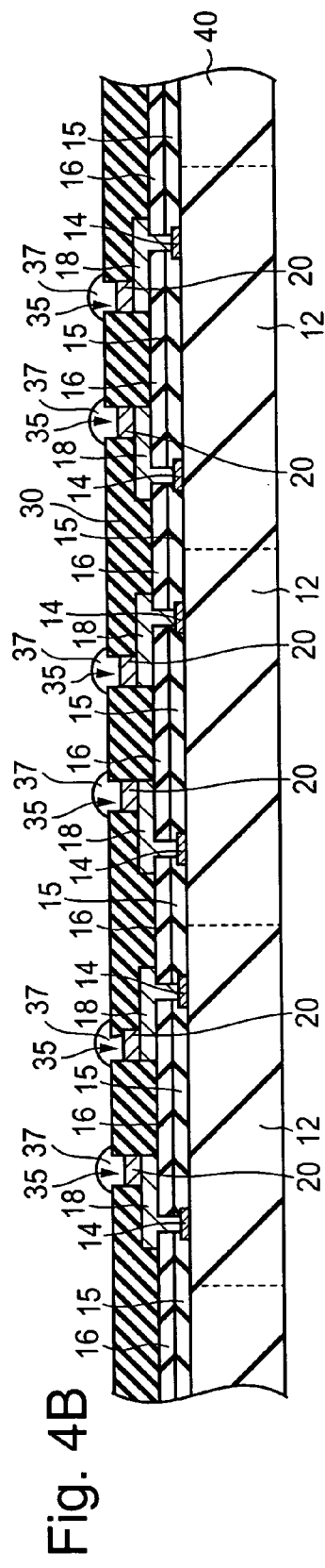

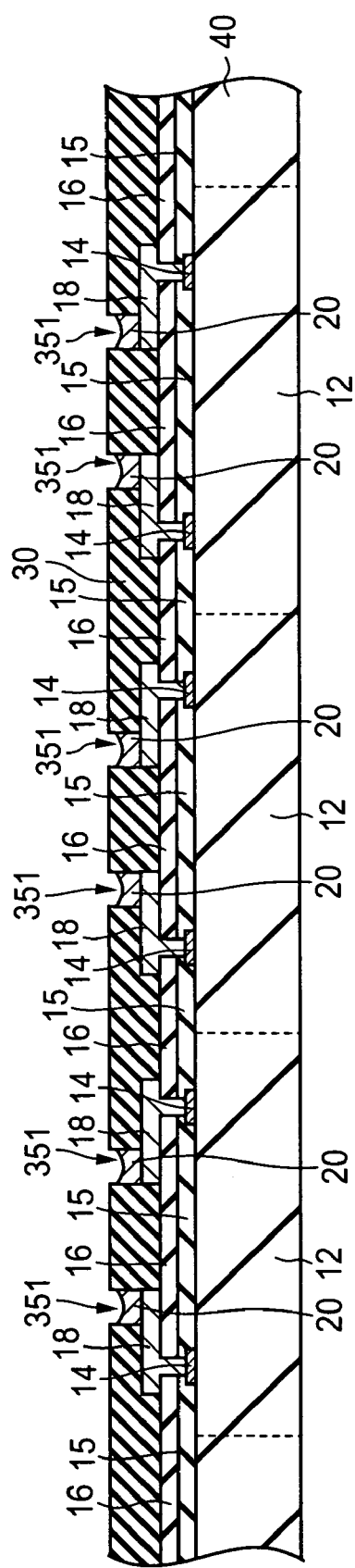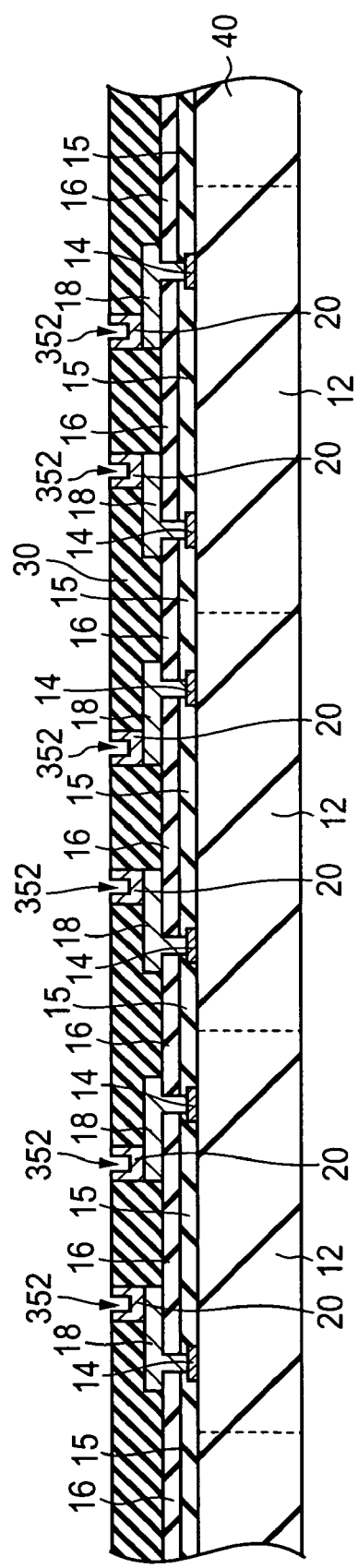
Fig. 6A
Fig. 6B

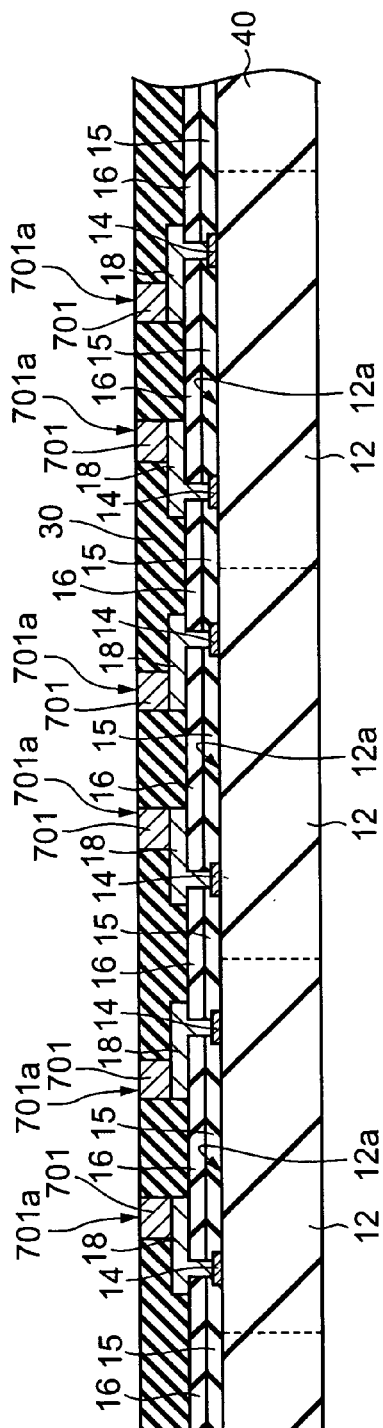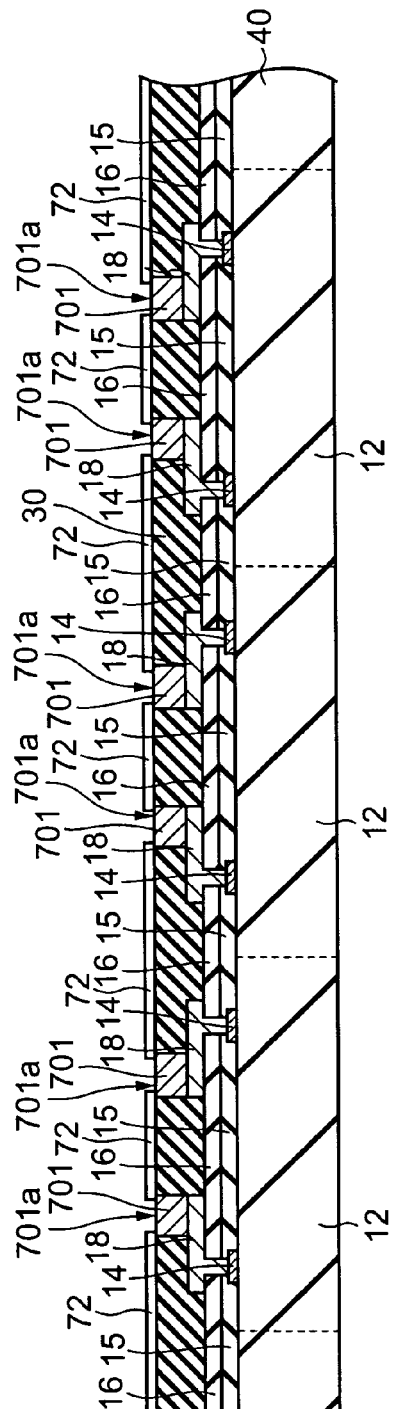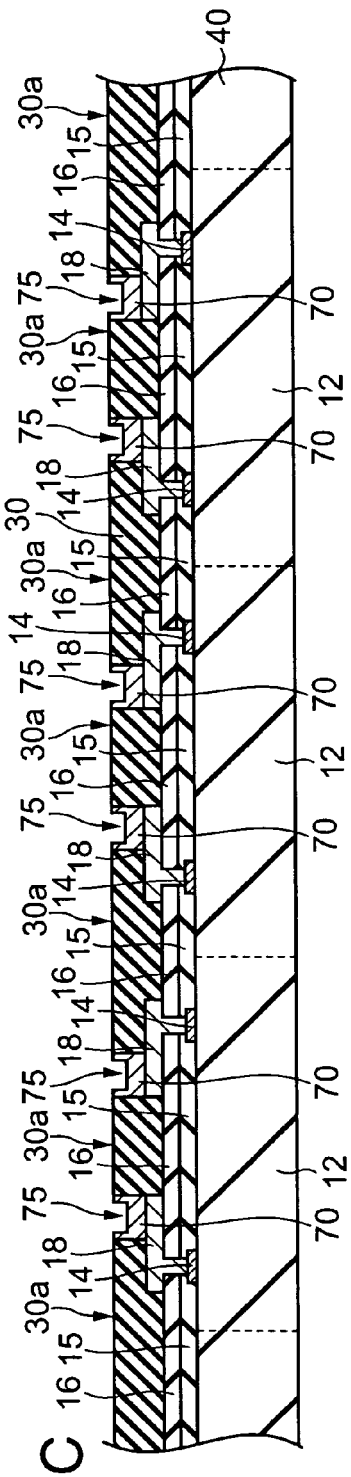

US 7,227,263 B2

SEMICONDUCTOR DEVICE WITH RECESSED POST ELECTRODE

CROSS REFERENCE TO RELATED APPLICATION

A claim of priority under 35 U.S.C. §119 is made to Japanese Patent Application No. 2004-81491, filed Mar. 19, 2004, which is herein incorporated by reference in their entirety for all purposes.

BACKGROUND OF THE INVENTION

1. Field of the Invention

The present invention relates to a semiconductor device.

2. Description of the Related Art

When a semiconductor device is used in a portable device, downsizing of the semiconductor device is needed. A package called a Chip Size Package (hereinafter, called CSP) has therefore been developed. The CSP is similar in size to a semiconductor chip. A type of CSP is called a wafer level chip size package (Wafer Level Chip Size Package: WCSP) or wafer level chip scale package (Wafer Level Chip Scale Package: WCSP).

A structure of an external terminal which is used in WCSP is described in reference 1: Japanese Patent No. 3217046, and reference 2: Japanese Patent Laid-Open No. 2002-170427.

In the conventional WCSP, a top surface of a post electrode is coplanar with a surface of a sealing resin, and an external terminal is formed on the top surface of the post electrode. Accordingly, the external terminal is connected to the post electrode with a small area, and reliability of the connection might be reduced.

SUMMARY OF THE INVENTION

Accordingly, in one aspect of the present invention, a semiconductor device which has a higher reliability is provided. The semiconductor device includes a semiconductor chip which has a top surface, a conductive member which includes a first portion which is located on the electrode pad and a second portion which is extended from the first portion, and a sealing resin which seals the top surface of the semiconductor chip and the conductive member. A top surface of the second portion is exposed from the sealing resin and a part of the top surface of the second portion is concaved from a surface of the sealing resin. An external electrode is formed on the top surface of the second portion.

BRIEF DESCRIPTION OF THE DRAWINGS

FIG. 2(A) to FIG. 2(C) are cross-sectional views showing manufacturing steps of the semiconductor package of the first embodiment.

FIG. 4(A) to FIG. 4(C) are cross-sectional views showing manufacturing steps of the semiconductor package of the first embodiment.

FIG. 6(A) and FIG. 6(B) are cross-sectional views showing semiconductor packages of alternative embodiments of the first embodiment.

FIG. 8(A) to FIG. 8(C) are cross-sectional views showing manufacturing steps of the semiconductor package of the second embodiment.

DETAILED DESCRIPTION OF THE PREFERRED EMBODIMENTS

Figure 1A:
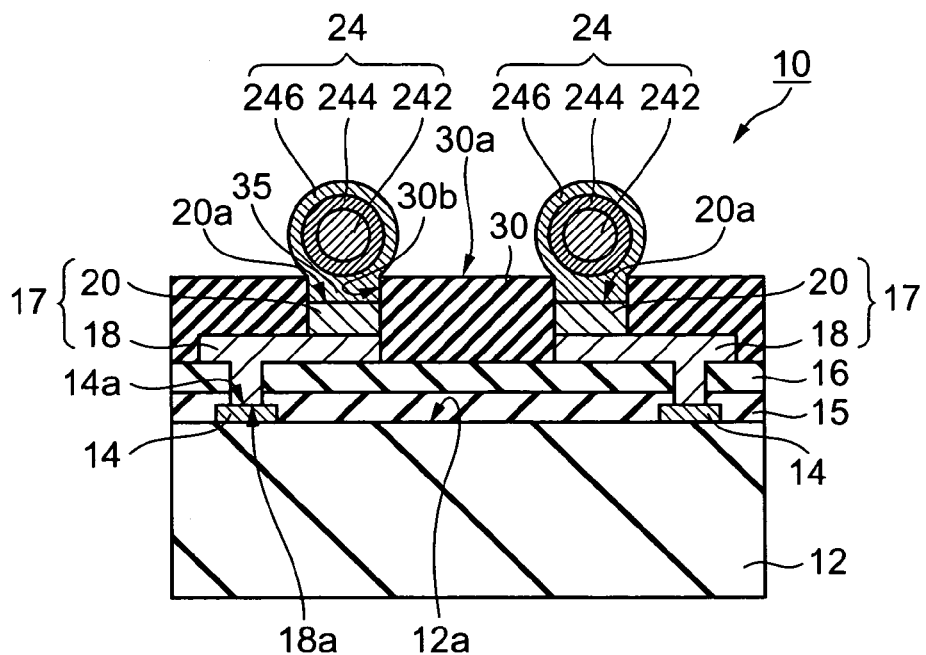
FIG. 1(A) is a cross-sectional view showing a semiconductor package of a first embodiment of a present invention.

Semiconductor devices according to preferred embodiments of the present invention will be explained hereinafter with reference to the accompanying figures. In order to simplify the explanation, like elements are given like or corresponding reference numerals. Dual explanations of the same elements are avoided.

A semiconductor package 10 as shown in FIG. 1(A) has a plurality of electrode pads 14 on a top surface 12a of a semiconductor chip 12. In this embodiment, the semiconductor package 10 is a WCSP type. The electrode pads 14 such as aluminum are electrically connected to a circuit element which is formed in the top surface of the semiconductor chip 12. A passivation layer 15 such as silicon dioxide or silicon nitride and an insulating layer 16 such as polyimide are formed on the top surface 12a of the semiconductor chip 12. A top surface 14a of the electrode pads 14 are exposed by the passivation layer 15 and the insulating layer 16. The insulating layer 16 has a function for absorbing a thermal stress. The electrode pad 14 is electrically connected to a conductive member 17. The conductive member 17 includes a first portion 18 and a second portion 20. The first portion 18 is arranged on the electrode pad 14. The first portion 18 includes a first surface 18a which contacts the top surface 14a of the electrode pad 14, and an extended portion which is arranged on the insulating layer 16 and extends along the top surface 12a of the semiconductor chip 12. The first portion is generally called as redistribution portion. The second portion 20 is formed on the first portion 18 and has a top surface 20a. The second portion 20 is also called post portion 20. The redistribution portion 18 and the post portion 20 are made of copper. Dome shaped external terminals 24 are formed on the top surface 20a of the post portions 20. A location of the external terminal 24 can be shifted by the redistribution 18. The external terminal 24 includes a core portion 242, a metal layer 244 which is formed on the core portion 242, and a solder layer 246 which is formed on the metal layer 244. A sealing resin 30 such as epoxy resin is formed on the top surface 12a of the semiconductor chip 12.

In this embodiment, a part of the top surface 20a of the post portion 20 is recessed from a surface 30a of the sealing resin 30. In the semiconductor package as shown in FIG. 1(A) the entire surface of the top surface 20a of the post portion is recessed from the surface 30a of the sealing resin 30. A concave recess portion 35 is formed in the sealing resin 30, and a part of the external terminal 24 is filled in the concave recess 35. That is, the external terminal 24 can be contacted with a side surface 35b of the sealing resin 30 and the top surface 20a of the post portion 20. As a result, the external terminal 24 can be adhered strongly with the post portion 20.

Next, a semiconductor device 100 which includes a motherboard 50 is described.

Figure 1B:
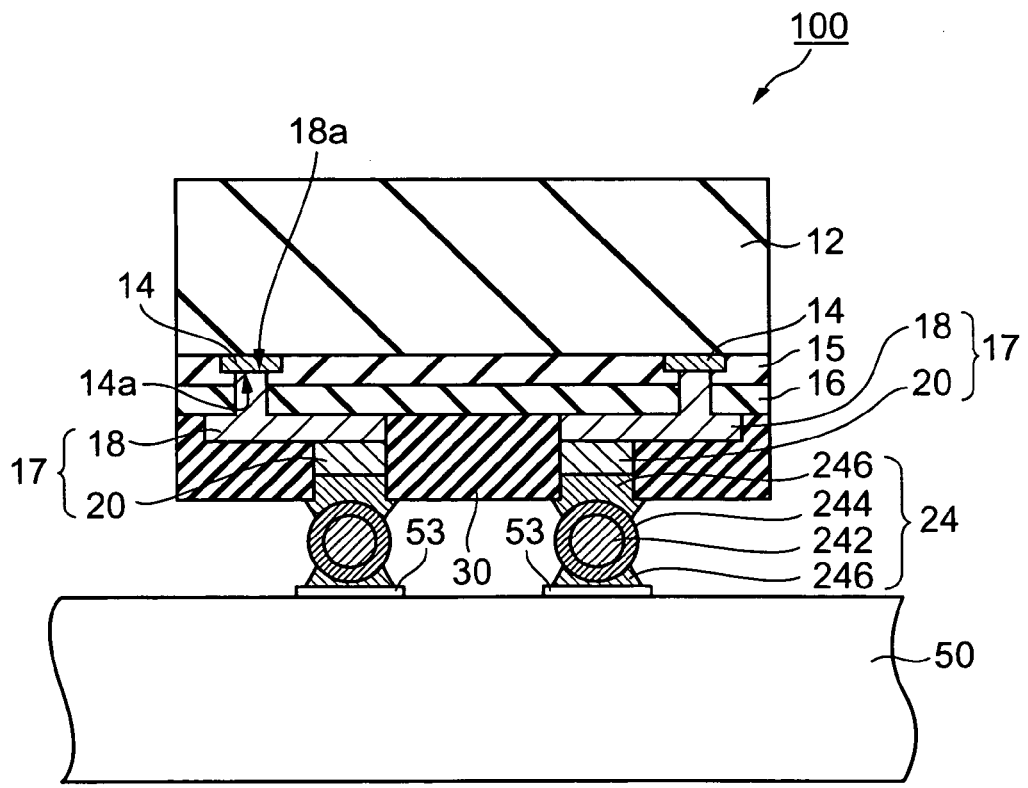
FIG. 1(B) is a cross-sectional view showing a semiconductor device of the first embodiment of the present invention.

The motherboard 50 has electrode pads 53 as shown in FIG. 1(B). The semiconductor package 10 is mounted on the motherboard 50 by connecting the external terminals 24 to the electrode pads 53.

In this embodiment, the external terminal 24 is securely contacted with the post portion 20. Therefore, the semiconductor package 10 can be securely contacted with the motherboard 50. As a result, the semiconductor package can be connected to the motherboard 50 with higher reliability.

Next, a method of manufacturing the semiconductor package 10 is described by referring to FIG. 2(A) to FIG. 5.

First, a semiconductor wafer 40 which includes the semiconductor chips 12 is provided. Each of the semiconductor chips 12 has the electrode pads 14 on the top surface of the 12a.

Then, the passivation layer 15 such as silicon dioxide and the insulating layer 16 such as polyimide are formed on an entire surface of the wafer 40 as shown in FIG. 2(A). A part of the passivation layer 15 and the insulating layer 16 that are located on the electrode pads 14 are removed.

Then, a copper layer is formed on the insulating layer 16 and on the exposed electrode pads 14 by a sputtering method. Then, the redistributions 18 are obtained by patterning the copper layer as shown in FIG. 2(B). A surface 18a of the redistribution 18 is contacted to the electrode pad 14. Then, post portions 201 are formed on the rewiring 18 as shown in FIG. 2(C). The post portion 201 has a 400 μm diameter and a 100 μm height.

Figure 3A:
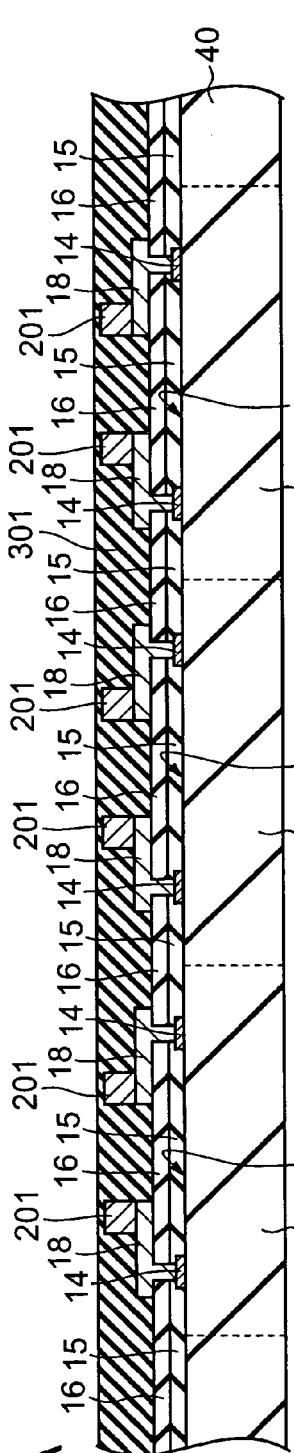
FIG. 3(A) to FIG. 3(C) are cross-sectional views showing manufacturing steps of the semiconductor package of the first embodiment.
Figure 3B:
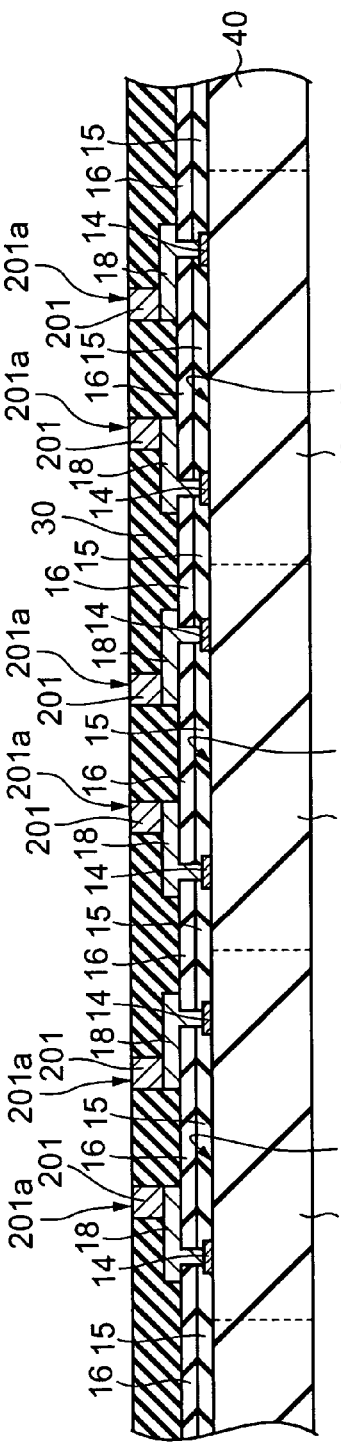

Then, a sealing resin layer 301 is formed on the wafer 40 by coating an epoxy resin as shown in FIG. 3(A). The coating is performed by a spin coating method. Then, a top surface 201a of the post portion 201 is exposed by polishing the sealing resin layer 301 as shown in FIG. 3(B).

Figure 3C:
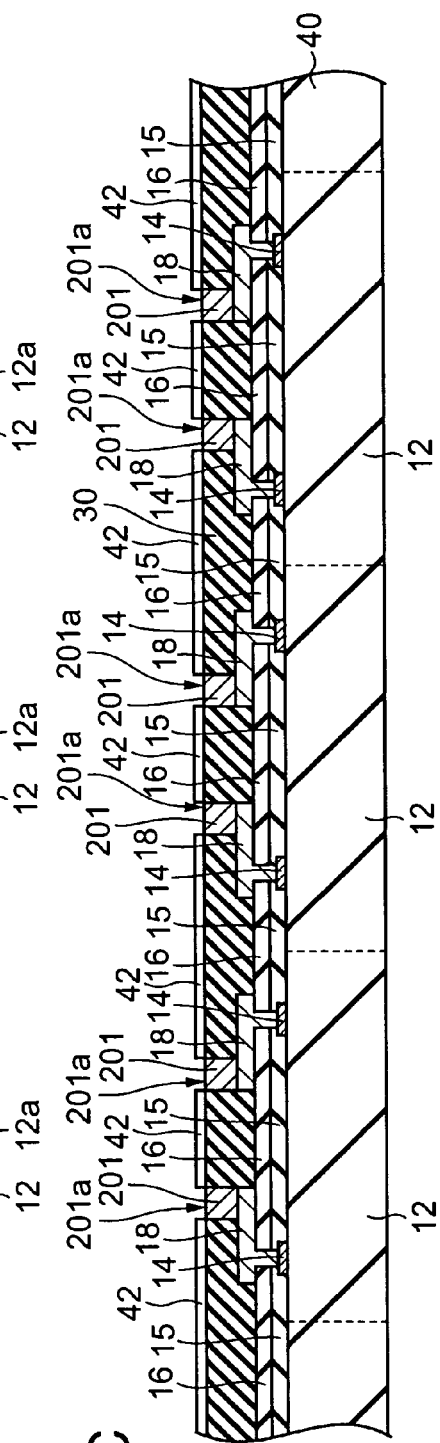

Then, a mask pattern 42 is formed on the wafer 40 as shown in FIG. 3(C). The top surfaces 201a of the post portions 201 are exposed from the mask pattern 42. Then, concave portions 35 which correspond to the post portion 201 are formed in the top surface 30a of the sealing resin 30 by etching a part of the post portions 201 as shown in FIG. 4(A). The etching is performed by a wet etching method which uses a highly acidic solution such as hydrochloric acid or hydrofluoric.

A depth of the concave recess 35 ranges from 2% to 10% of the diameter of the post portion 201. In this embodiment, the depth of the concave recess 35 is 20 μm.

Then, flux 37 is filled in the concave portions 35 as shown in FIG. 4(B). The flux 37 has a function of removing an oxide layer which is formed on the post portion 20 and to improve an adhesion of solder to the post portion 20. The flux 37 is formed by a pin transfer method.

Then, solder balls 241 are arranged on the concave portions 35 via the flux 37 as shown in FIG. 4(C). A diameter of the solder ball 241 is 500 μm. The solder ball 241 includes the plastic core portion 242, the metal layer 244 which is formed on the core portion 241, and the solder layer 2461 which is formed on the metal layer 244. The multilayered solder ball 241 can absorb a thermal stress by the core portion 242. Therefore, a crack which is generated in the solder layer 244 is inhibited.

A material of the metal layer 244 is selected from a material which has a melting point of 900° C. and more. The material of the metal layer 244 can be selected from gold (Au), silver(Ag), copper(Cu), platinum(Pt), palladium(Pd), cobalt(Co), nickel(Ni), and iron(Fe).

In this embodiment, a melting point of the solder layer 2461 is 350° C. and less. The material of the solder ball 2461 can be made of an alloy of tin(Sn) and lead(Pb), or an alloy of indium(In), tin(Sn) and lead(Pb).

Figure 5:
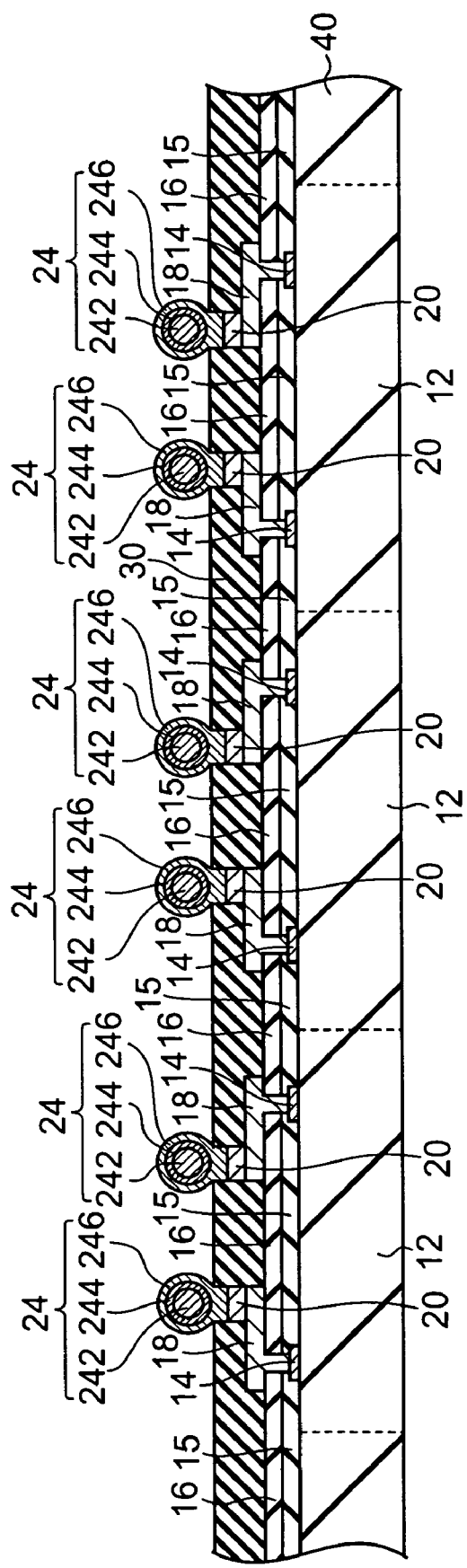
FIG. 5 is a cross-sectional view showing manufacturing steps of the semiconductor package of the first embodiment.

Then, the external terminals 24 are formed by heating the solder ball 241 as shown in FIG. 5. After the melting, the remaining flux is removed. The solder ball 241 is heated by a temperature between the melting point of the solder layer 2461 and the metal layer 244.

In this embodiment, the flux 37 holds the solder ball 241 before the solder ball 241 is heated. Therefore, the external terminal 24 can be made at the set point with accuracy.

Accordingly, a part of solder of the external terminal is embedded in the concave recess 35, the adhesion between the external terminal 24 and the post 20 is improved.

After the external terminals 24 are formed, the individual WCSP 10 is obtained by cutting with a dicing blade as shown in FIG. 1.

Next, a mounting method of the WCSP 10 to the motherboard 50 is described. First, the WCSP 10 is arranged on the motherboard 50 with contacting the external terminals 24 to the electrode pads 53.

Then, external terminals 24 are heated by the temperature between the melting point of the solder layer 246 and the melting point of the metal layer 244. As a result, the WCSP 10 is electrically connected to the motherboard 50 by the solder layer 246 which is filled between the post portion 20 and the electrode pad 53 as shown in FIG. 1(B).

In this embodiment, the entire top surface 201a of the post portion 201 is removed for forming the concave recess 35. However, a concave area 351 can be formed in the top surface 20a of the post portion 20 as shown in FIG. 6(A). Alternatively, a concave area 352 can be formed in a part of the top surface 20a of the post portion 20 as shown in FIG. 6(B).

Next, a semiconductor package 200 of a second embodiment is described by referring to FIG. 7(A) to FIG. 9(C).

Figure 7A:
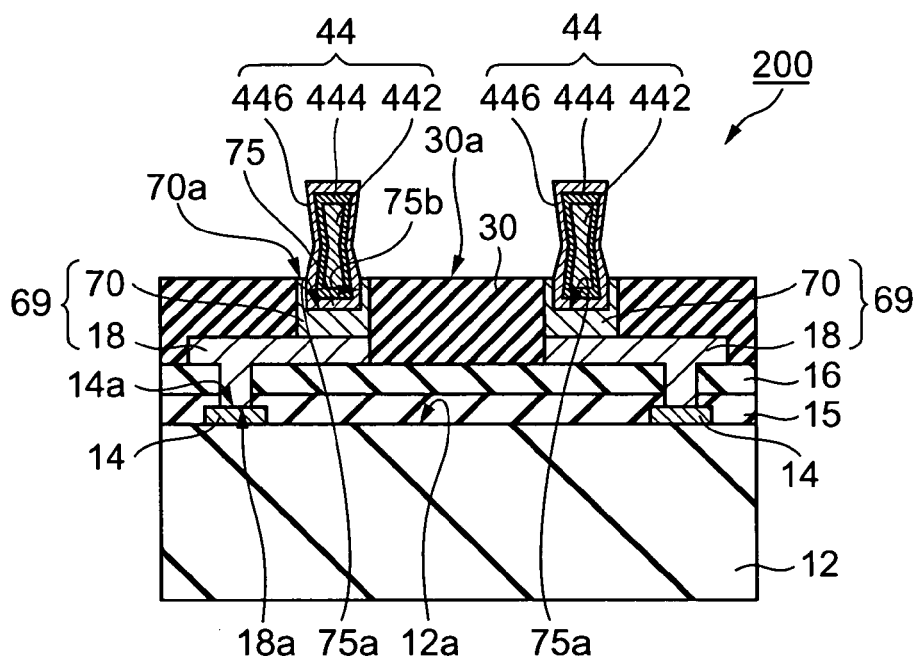
FIG. 7(A) is a cross-sectional view showing a semiconductor package of a second embodiment of the present invention.

In this embodiment, an external terminal 44 is formed a post portion 70 as shown in FIG. 7(A). The external terminal 44 has a post shape which is arranged in a direction in which the post portion 70 is extended. A part of the external terminal 44 is embedded in a concave portion 75 which is formed in the post portion 70. The external terminal 44 includes a core portion 442 such as plastic, a metal layer 444 which is formed on the core portion 442, and a solder layer 446 which is formed on the metal layer 444. The external terminal 44 is hourglass shaped. That is, a middle area of the external terminal 44 is narrower than both ends of the external terminal 44. The hourglass shaped external terminal 44 reduces a stress in the external terminal 44.

A method of manufacturing the semiconductor package 200 is described by referring to FIG. 8(A) to FIG. 9(C).

The semiconductor wafer providing step to the resin sealing step are performed in the same manner as the first embodiment. The semiconductor wafer after the sealing step is performed is shown in FIG. 8(A). In this embodiment, a diameter of a post portion 701 is 500 μm and a height of the post portion 701 is 100 μm.

Then, a mask pattern 72 is formed on the sealing resin as shown in FIG. 8(B). The mask pattern 72 has openings which are located on the post portions 701.

Then, the concave portion 75 is formed in the top surface 701a of the post portion 701 by a wet etching method as shown in FIG. 8(C). In this embodiment, a depth of the concave portion 75 is 25 μm.

The concave portion 75 has a function of storing flux, supporting the external terminal 44, and improving an adhesion between the post portion 70 and the external terminal 44. Therefore, the depth of the concave portion 75 ranges from 2% to 10% of the diameter of the post portion 701.

Figure 9A:
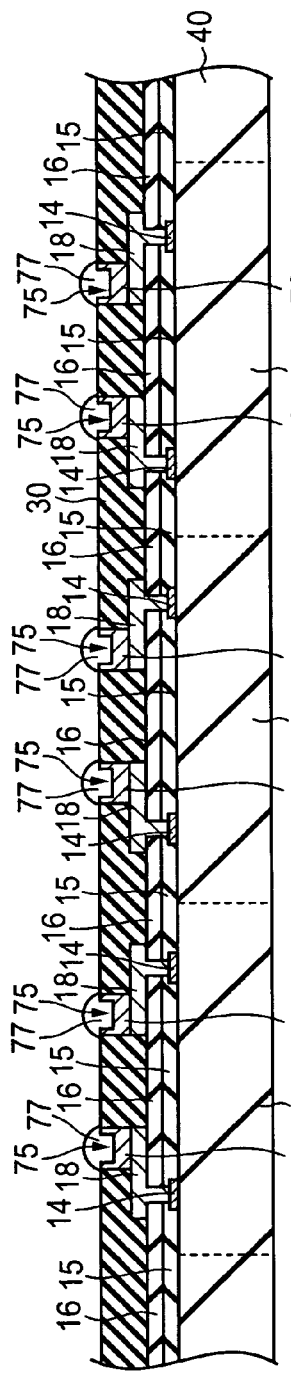
FIG. 9(A) to FIG. 9(C) are cross-sectional views showing manufacturing steps of the semiconductor package of the second embodiment.

Then, the flux 77 is supplied to the concave portion 75 as shown in FIG. 9(A).

Figure 9B:
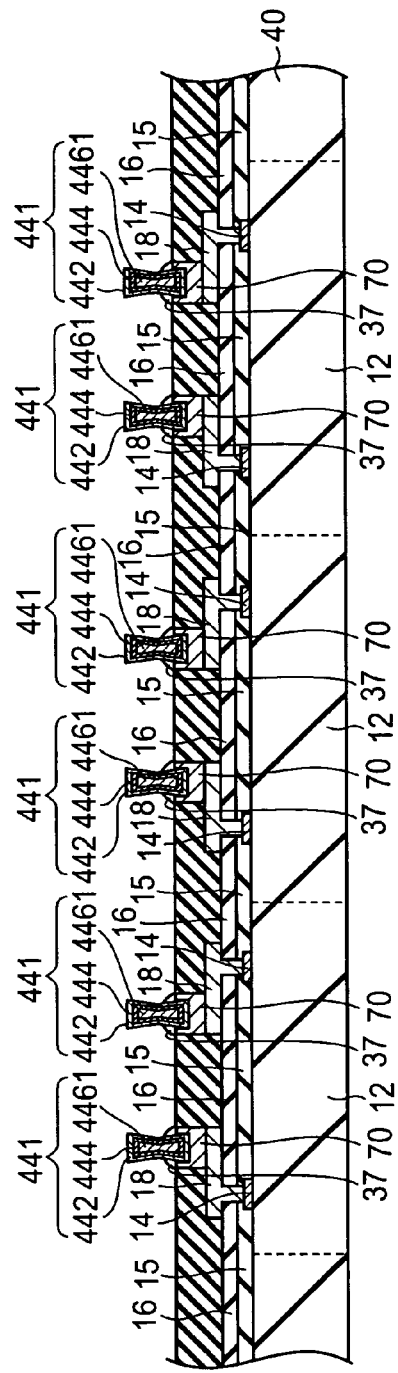

Then, solder posts 441 are inserted in the concave portions 75 as shown in FIG. 9(B). A diameter of the solder post 441 is 400 μm and a height of the solder post 441 is 500 μm.

The solder post 441 includes the core portion 442 such as plastic, the metal layer 444 which is formed on the core portion 442, and the solder layer 4461 which is formed on the metal layer 444.

Figure 9C:
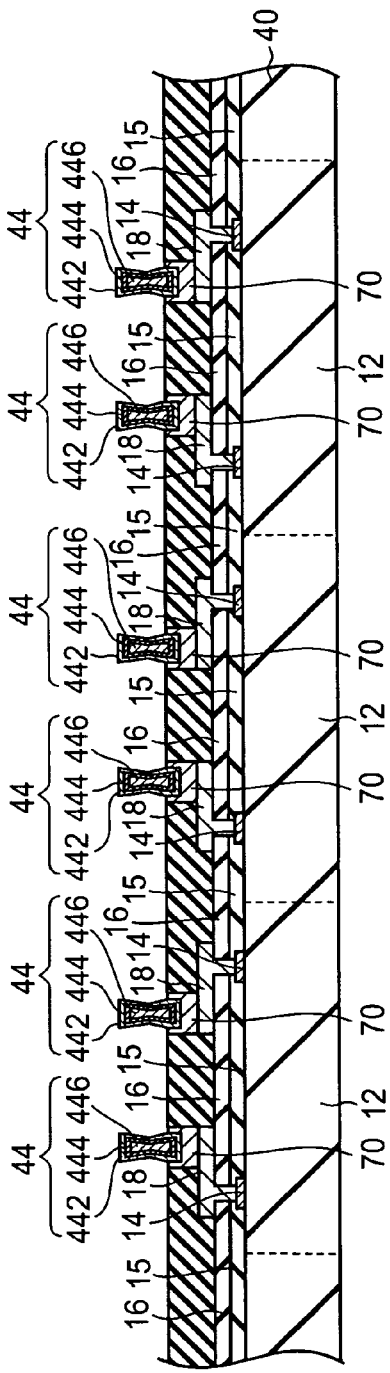

Then, the external terminal 44 is formed by heating the solder post 441, and then, the remaining flux 37 is removed as shown in FIG. 9(C). A temperature of the heating step is performed between a melting point of the solder layer 4461 and a melting point of the metal layer 444.

Accordingly, the solder post 441 is supported by the flux 37 before the heating, the external terminal 44 can be formed with accuracy. Accordingly, a part of the external terminal 44 is embedded in the concave portion 75, the connection between the external terminal 44 and the post portion 70 is strongly.

After the external terminals 44 are formed, the individual WCSP 200 is obtained by cutting with a dicing blade as shown in FIG. 7(A).

Next, a mounting method of the WCSP 200 to the motherboard 50 is described. First, the WCSP 200 is arranged on the motherboard 50 with contacting the external terminals 44 to the electrode pads 53.

Figure 7B:
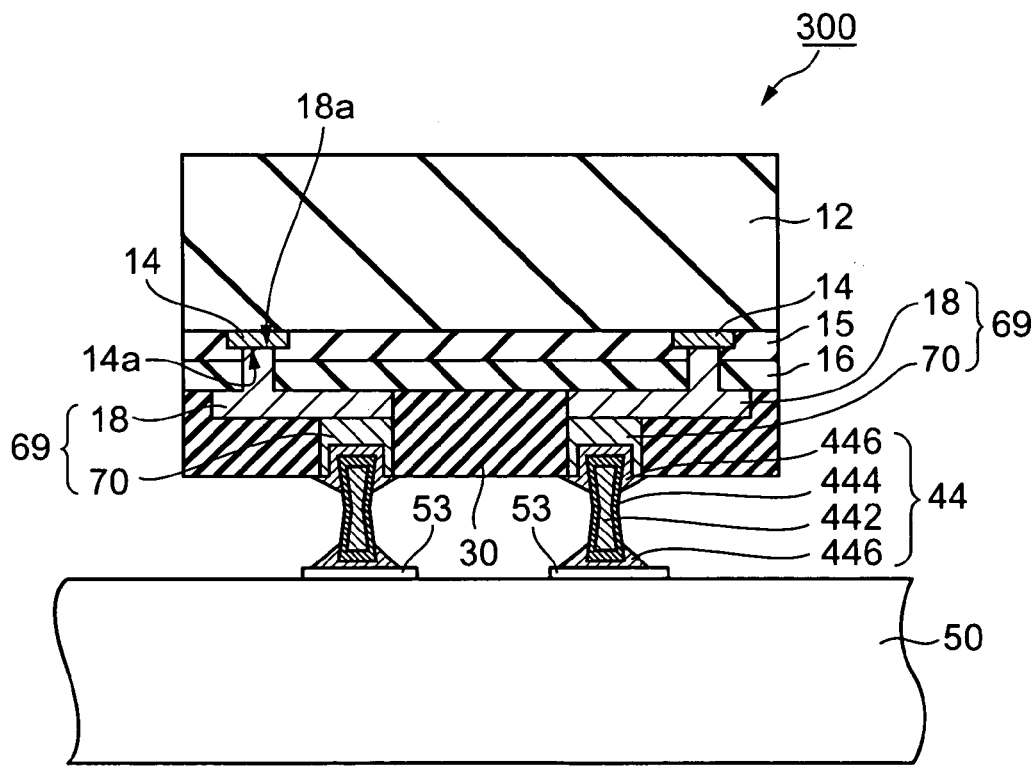
FIG. 7(B) is a cross-sectional view showing a semiconductor device of the second embodiment of the present invention.

Then, the external terminals 44 are heated by the temperature between the melting point of the solder layer 446 and the melting point of the metal layer 444. As a result, the WCSP 200 is electrically connected to the motherboard 50 by the solder layer 446 which is filled between the post portion 70 and the electrode pad 53 as shown in FIG. 7(B).

Next, a semiconductor package 400 of a third embodiment is described by referring to FIG. 10(A) to FIG. 15.

Figure 10A:
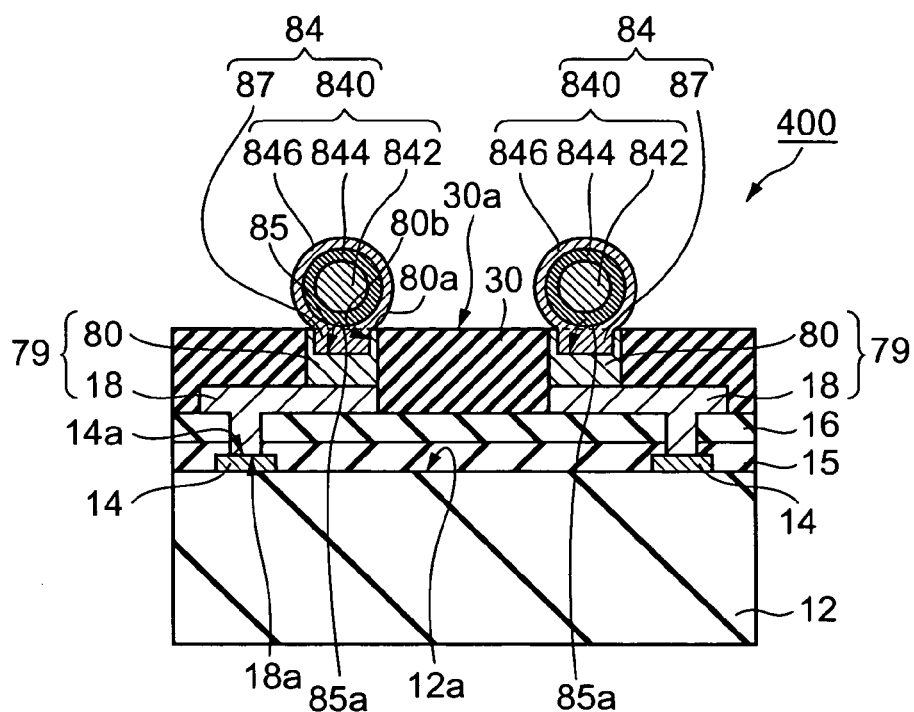
FIG. 10(A) is a cross-sectional view showing a semiconductor package of a third embodiment of the present invention.

In this embodiment, a solder 87 is filled in a concave portion 85. Then, a solder ball 840 is connected to the filled solder 87. The solder ball and the filled solder 87 make an external terminal 84 as shown in FIG. 10(A).

Accordingly, the external terminal 84 is embedded in the concave portion 85, the external terminal 84 can be contacted with a side surface of the concave portion 85 and a bottom surface 85a of the concave portion 85. As a result, the external terminal 84 can be securely adhered with the post portion 80.

Next, a method of manufacturing the semiconductor package 400 is described by referring to FIG. 11(A) to FIG. 15.

Figure 11A:
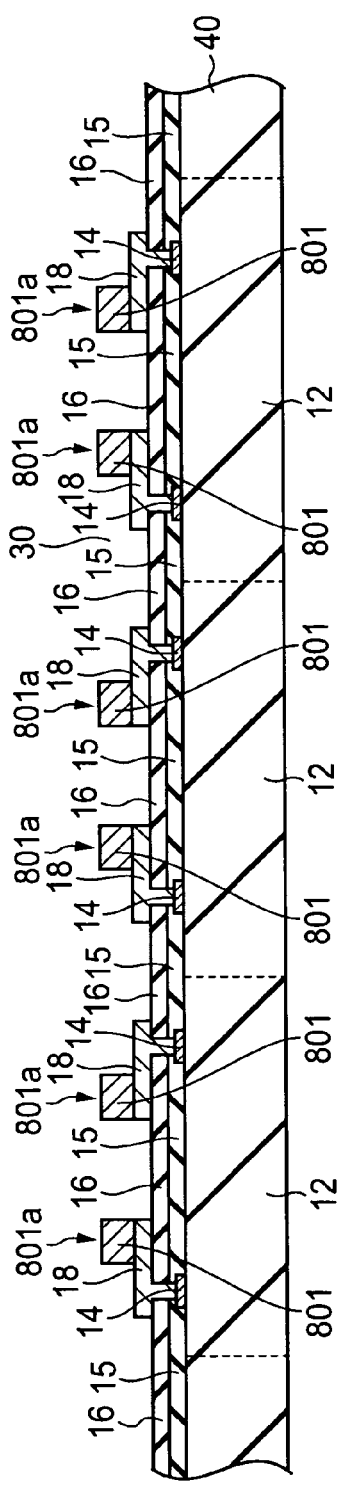
FIG. 11(A) to FIG. 11(C) are cross-sectional views showing manufacturing steps of the semiconductor package of the third embodiment.

From the semiconductor wafer providing step to the post portion forming step are performed as the same steps to the first embodiment. The semiconductor wafer after the post portion forming step is performed is shown in FIG. 11(A). A diameter of the post portion 801 is 500 μm and a height of the post portion 801 is 100 μm.

Figure 11B:
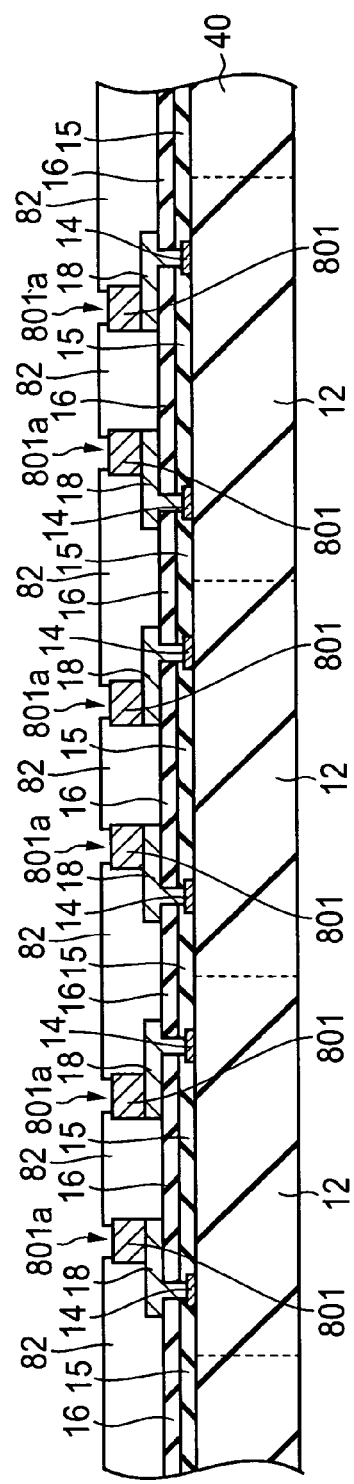

Then, a mask pattern 82 is formed on the post portion 801 as shown in FIG. 11(B). The mask pattern 82 includes an opening which is arranged on a part of a top surface 801a of the post portion 801.

Figure 11C:
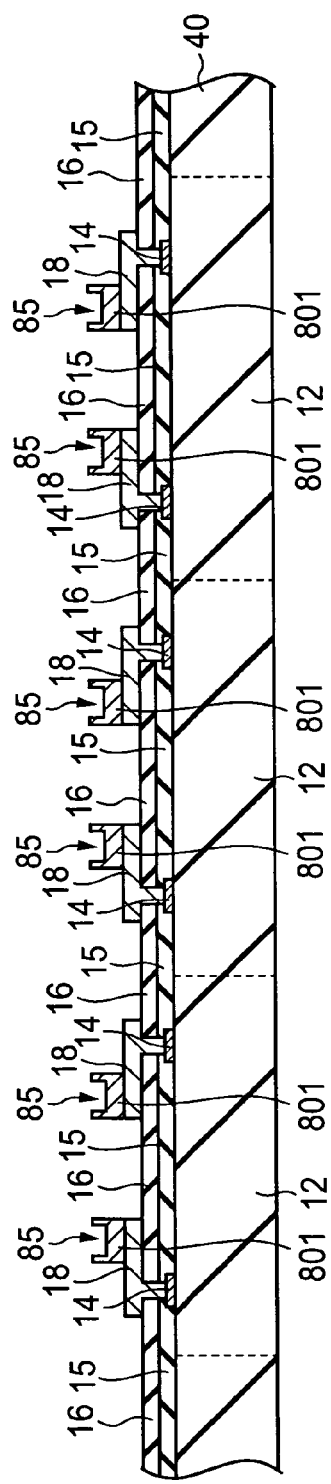

Then, the concave portion 85 is formed in the top surface 801a of the post portion 801 by etching the exposed portion of the post portion 801 as shown in FIG. 11(C). A diameter of the concave portion 85 ranges from 10% to 50% of a diameter of the post portion 801, and a depth of the concave portion 85 ranges from 20% to 70% of a height of the post portion 801.

Figure 12A:
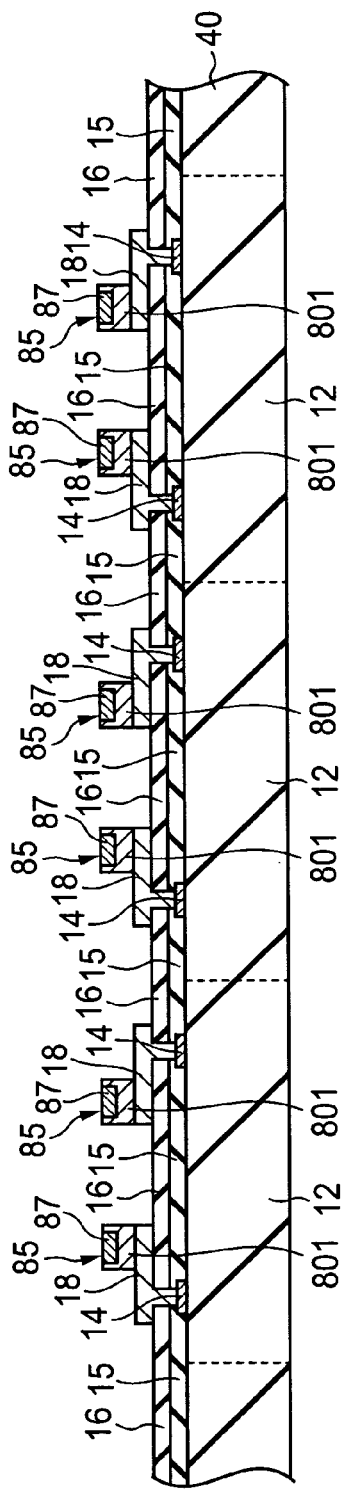
FIG. 12(A) to FIG. 12(C) are cross-sectional views showing manufacturing steps of the semiconductor package of the third embodiment.

Then, the concave portion 85 is filled by solder 87 as shown in FIG. 12(A). The solder filling step is performed by the plating method.

Figure 12B:
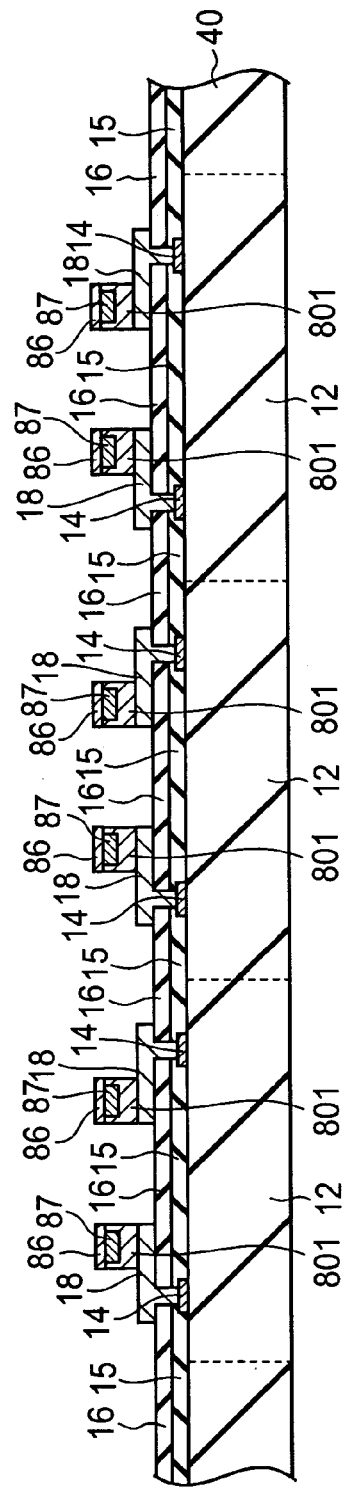
Figure 12C:
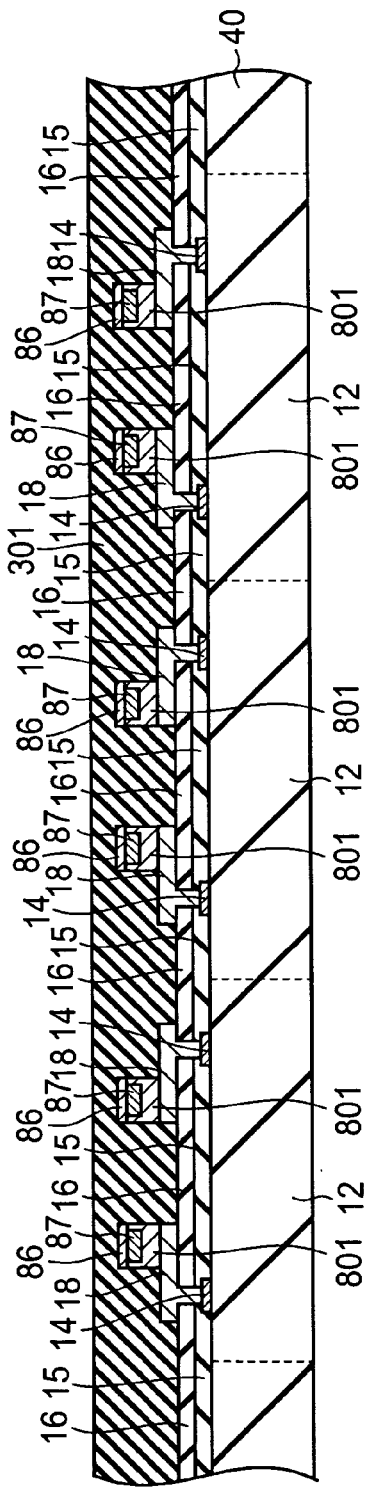
Figure 13A:
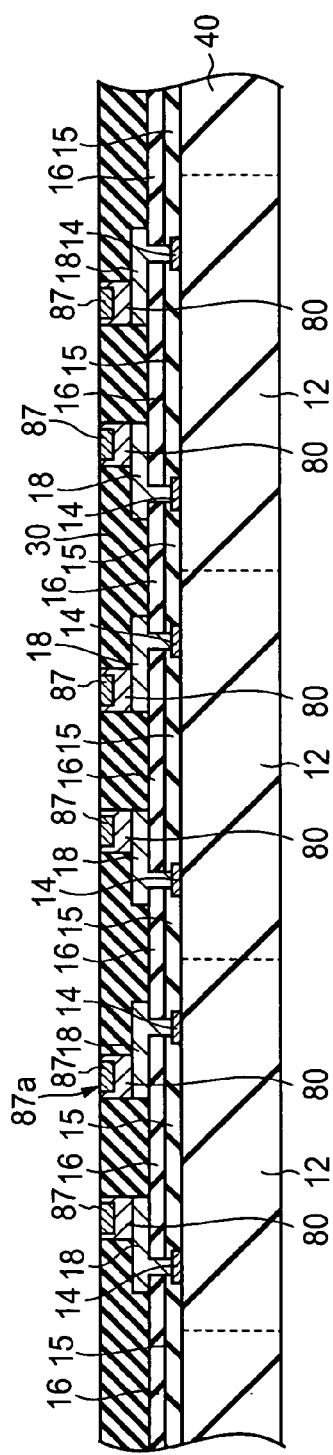
FIG. 13(A) to FIG. 13(C) are cross-sectional views showing manufacturing steps of the semiconductor package of the third embodiment.

Then, a cap portion 86 such as copper is formed on the concave portion 85 by the plating method as shown in FIG. 12(B). Then, a sealing resin 301 formed on the surface of the semiconductor wafer 40 as shown in FIG. 12(C). The sealing resin 301 seals the cap 86. The solder 87 is sealed by the cap portion 86. Therefore, the embedded solder 87 does not flow out, if the solder 87 is heated during the sealing step. Then, a sealing layer 30 which exposes a top surface 87a of the embedded solder 87 by polishing the sealing resin 301 and the cap portion 86 as shown in FIG. 13(A).

Figure 13B:
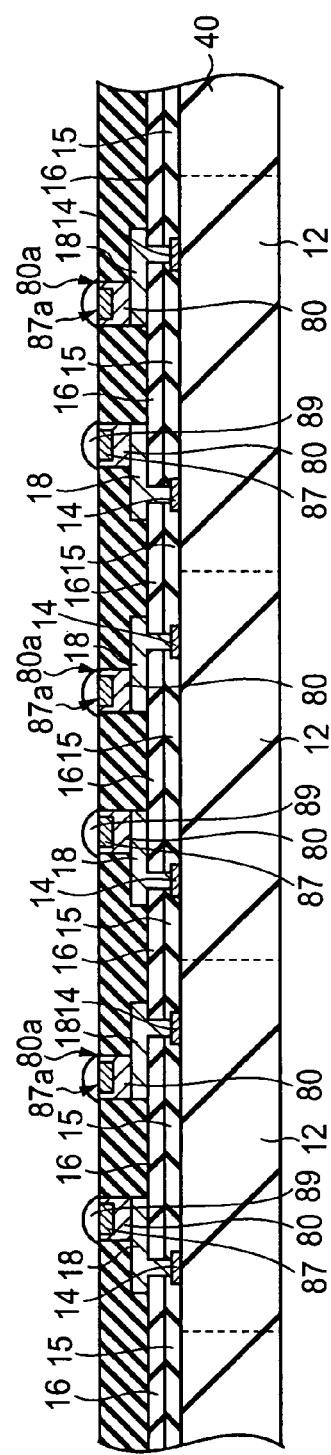

Then, flux 89 is supplied on the embedded solder 87 as shown in FIG. 13(B). The flux 89 is supplied by the pin transfer method.

Figure 13C:
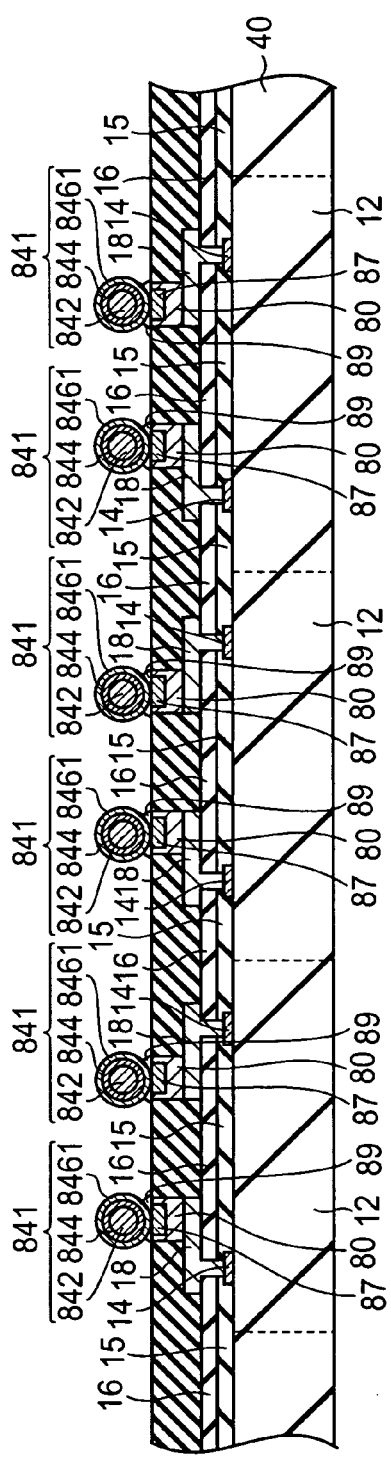

Then, the solder balls 841 are arranged on the flux 89 as shown in FIG. 13(C). The solder ball 841 includes a core portion 842, a metal layer 844 which is formed on the core portion 842, and a solder layer 8461 which is formed on the metal layer 844. A diameter of the solder ball 841 is 500 μm.

Figure 14:
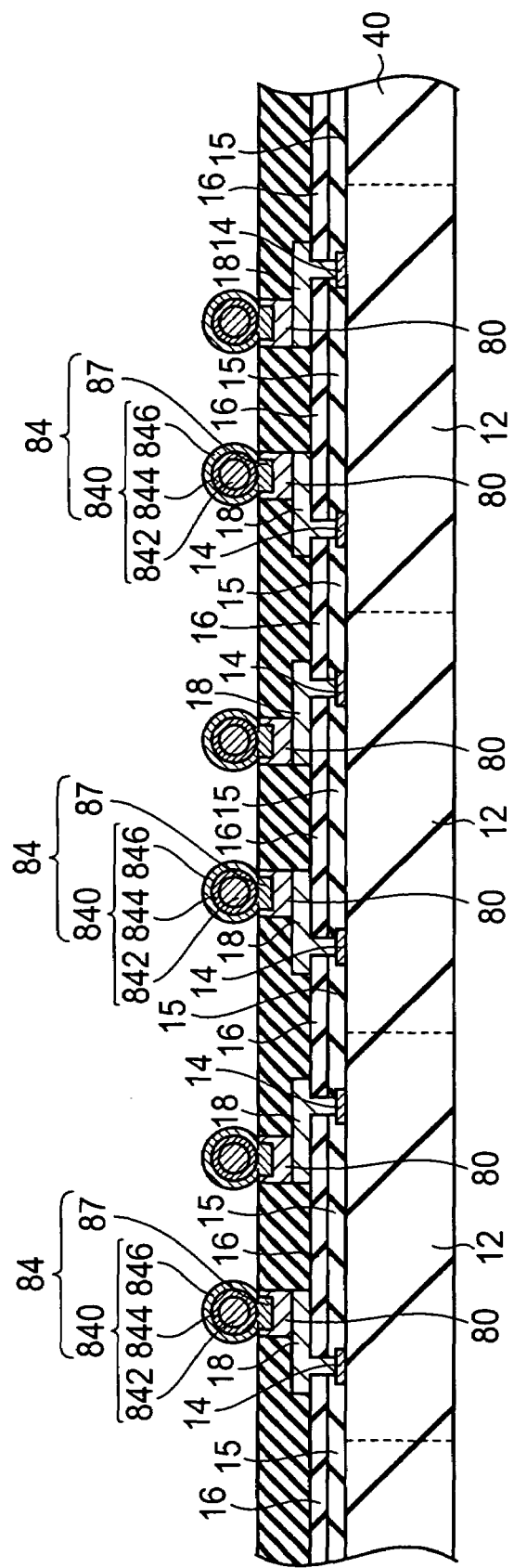
FIG. 14 is a cross-sectional view showing manufacturing steps of the semiconductor package of the third embodiment.

Then, the external terminal 84 is formed by heating the solder ball 841 as shown in FIG. 14. The heating is performed with a temperature between a melting point of the solder layer 8461 and a melting point of the metal layer 844. In the heating step, the embedded solder 87 and the solder layer 8461 of the solder ball 841 are melted and welded. As a result, a part of the external terminal 84 is embedded in the concave portion 85. Then, remaining flux is removed.

After the external terminals 84 are formed, the individual WCSP 400 is obtained by cutting with a dicing blade as shown in FIG. 10(A).

Figure 10B:
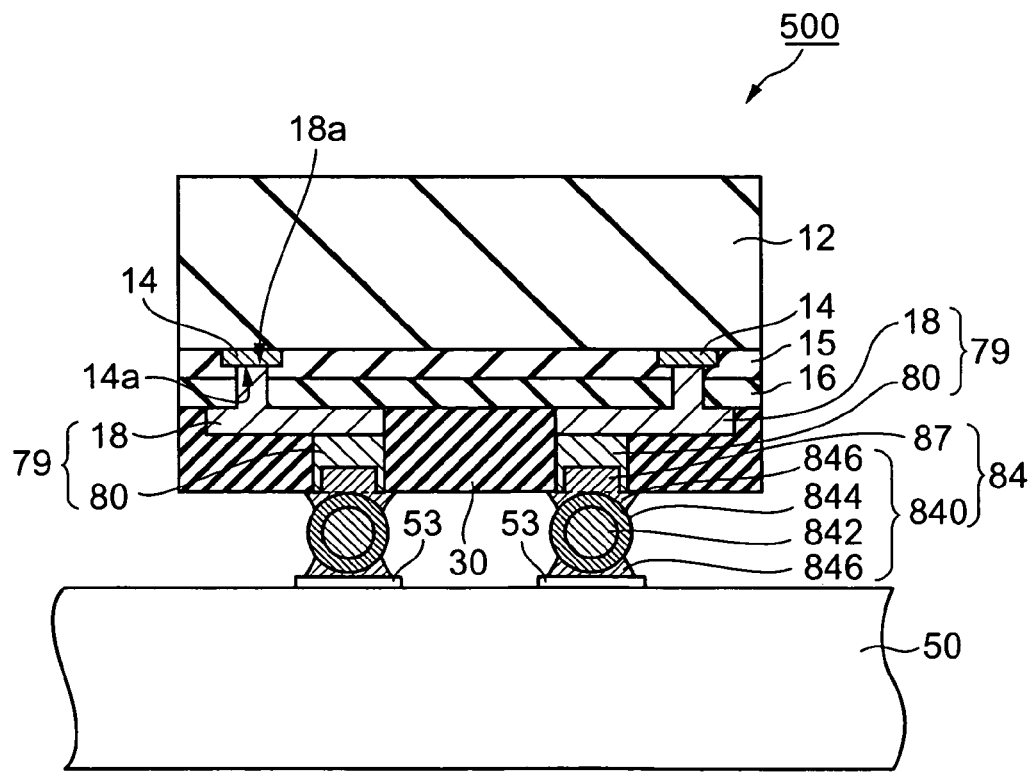
FIG. 10(B) is a cross-sectional view showing a semiconductor device of the third embodiment of the present invention.

The WCSP 400 is mounted on the motherboard 50, and a semiconductor device 500 is obtained as shown in FIG. 10(B)

Figure 15:
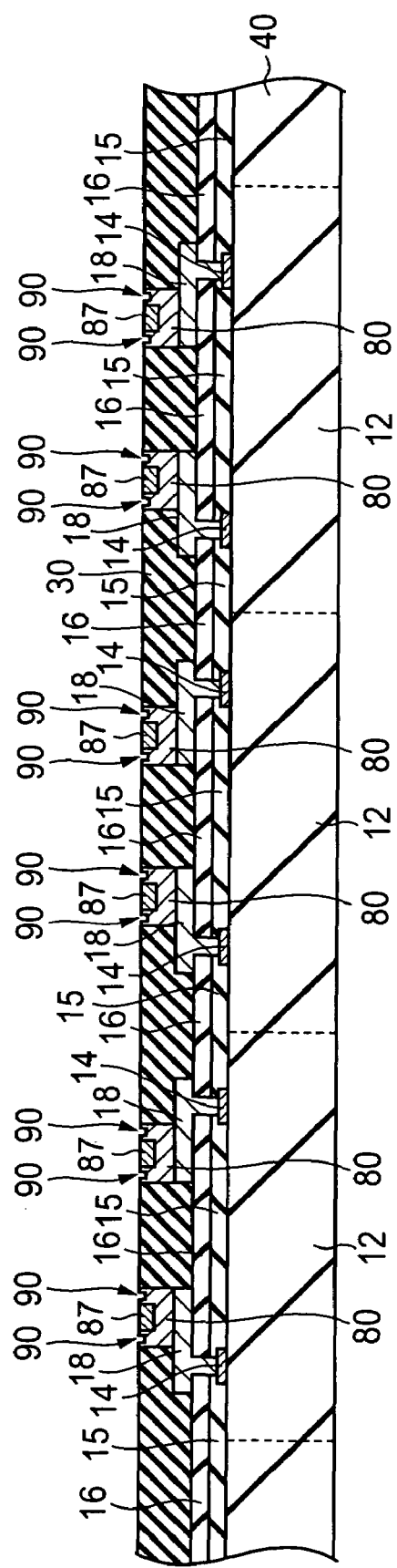
FIG. 15 is a cross-sectional view showing a semiconductor package of an alternative embodiment of the third embodiment.

A concave portion 90 can be formed around the embedded solder 87 as shown in FIG. 15. The concave portion 90 is also located on the top surface 80*a* of the post portion 80. Accordingly, the concave portion 90 holds the flux 89, a chance of shifting the solder ball 841 is reduced.

Figure 16A:
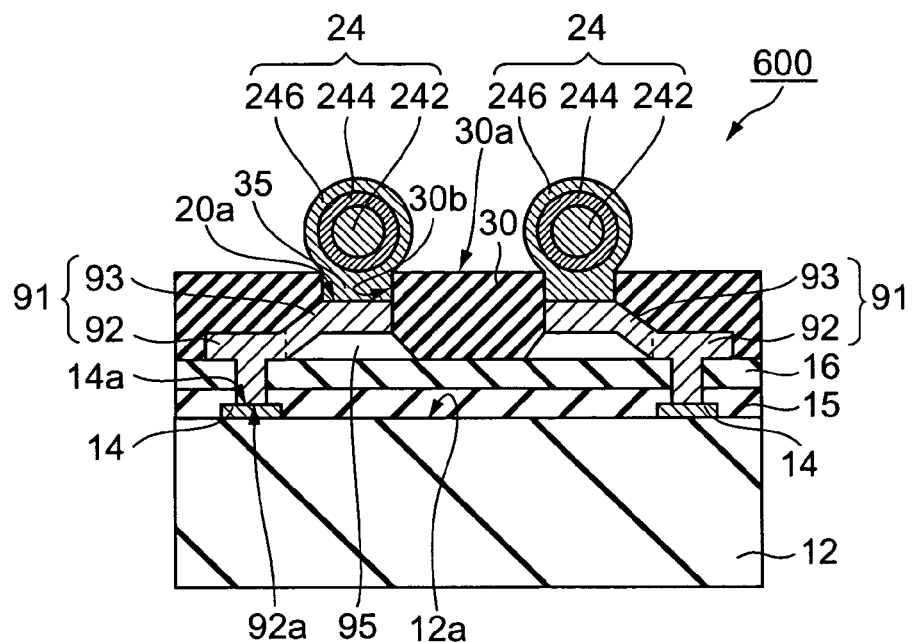
FIGS. 16(A) and 16(B) are cross-sectional views showing a semiconductor package of an alternative embodiment of the present invention.
Figure 16B:
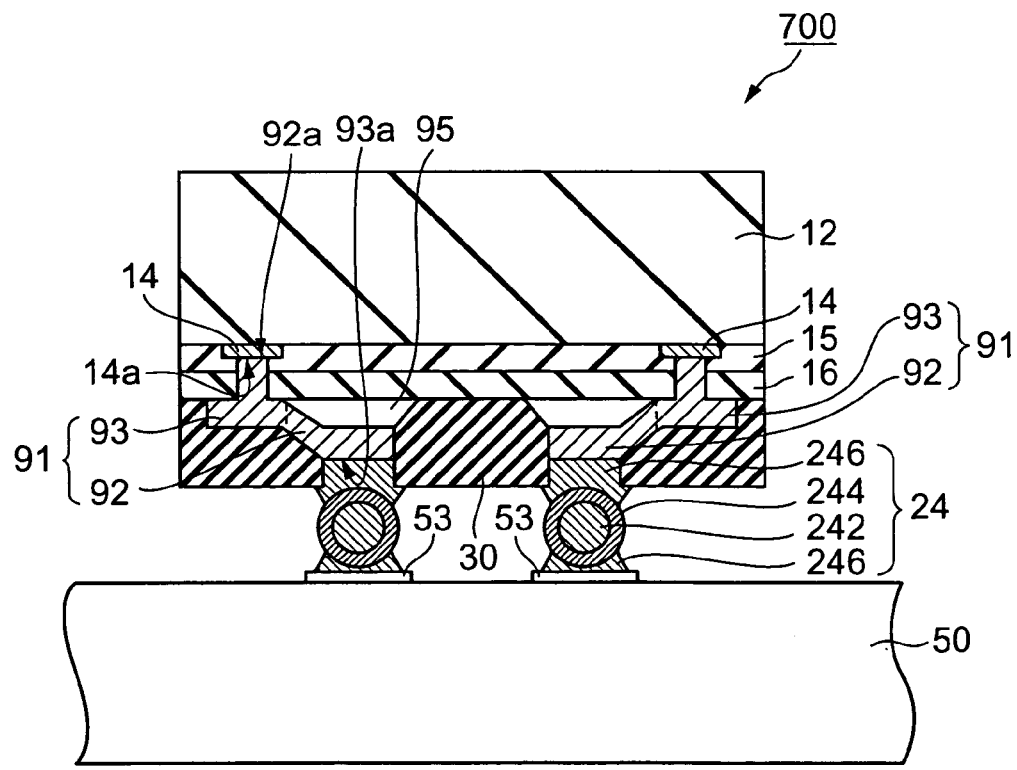

Alternatively, the redistribution 18 and the post portion 20 of the semiconductor package 10 which is disclosed in the first embodiment can be changed to a combination of a resin post 95 and redistribution 91 as shown in FIG. 16(A). The redistribution 91 includes a first portion 92 which is located along the top surface 12*a* of the semiconductor chip 12 and a second portion 93 which is extended from the first portion 92 to a top surface of the resin post 95. Also, when a semiconductor package 600 is mounted on the motherboard 50, a semiconductor device 700 is obtained as shown in FIG. 16(B).

Figure 17A:
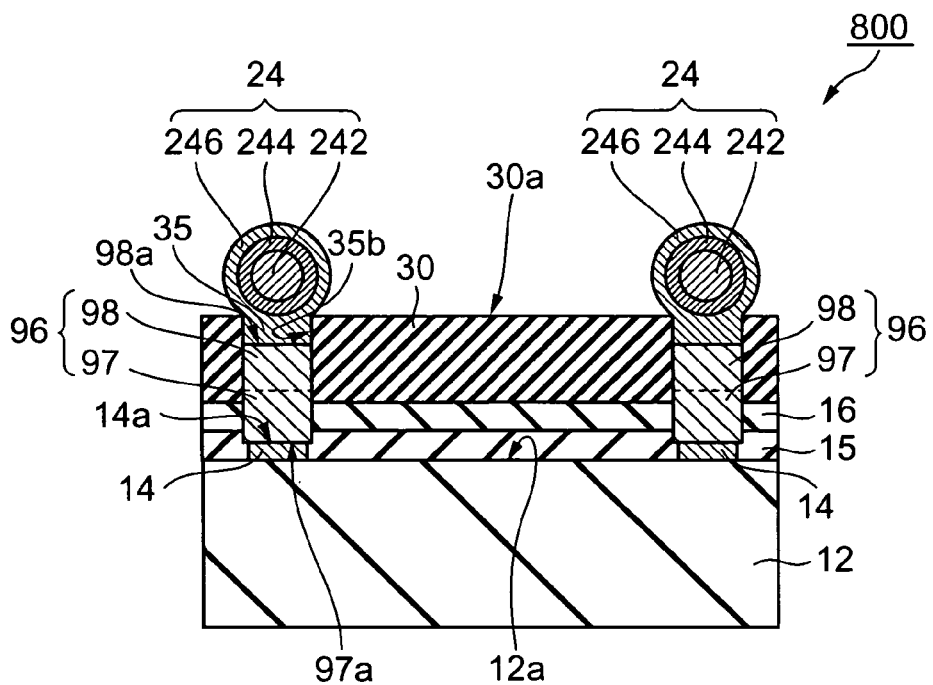
FIGS. 17(A) and 17(B) are cross-sectional views showing a semiconductor package of an alternative embodiment of the present invention.
Figure 17B:
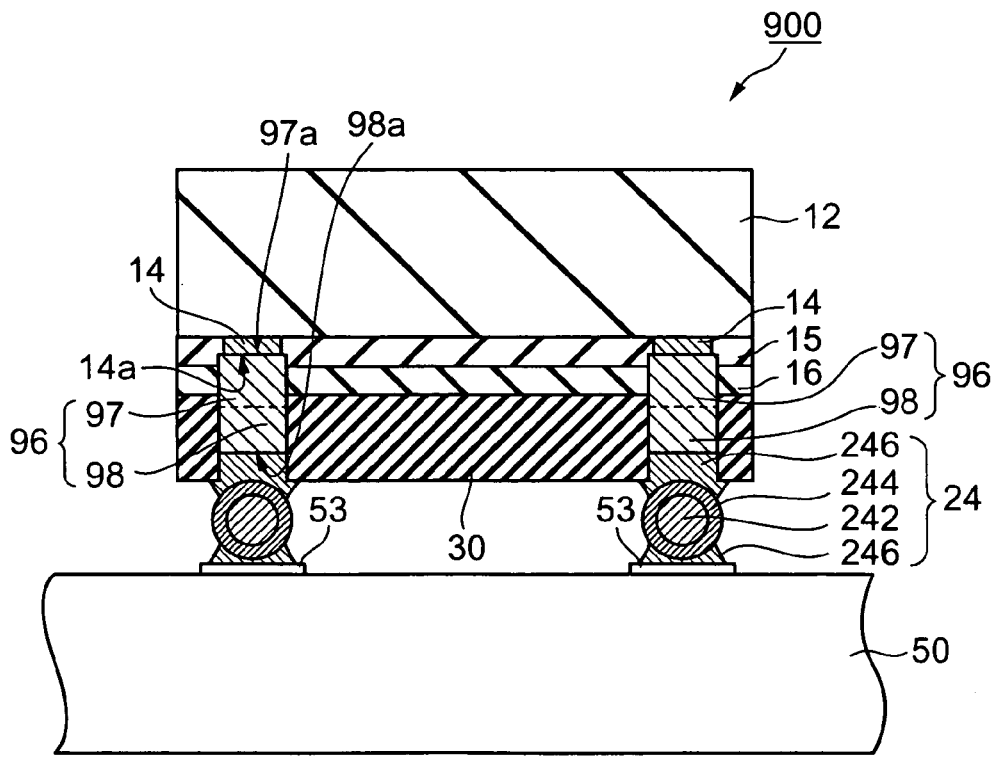

Alternatively, the redistribution 18 and the post portion 20 of the semiconductor package 10 which is disclosed in the first embodiment can be changed to a post portion 96 which is formed on the electrode pad 14 as shown in FIG. 17(A). The post portion 96 includes a first post portion 97 and a second post portion 98 which is formed on the first post portion 96. Also, when a semiconductor package 800 is mounted on the motherboard 50, a semiconductor device 900 is obtained as shown in FIG. 17(B).

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a semiconductor chip which has a top surface, wherein the top surface includes an electrode pad;
   an insulating layer which is formed on the top surface of the semiconductor chip, wherein the insulating layer has an opening which exposes the electrode pad;
   a conductive member which includes a first portion and a second portion, wherein the first portion is connected to the electrode pad via the opening, and wherein the second portion is extended from the first portion and located on the insulating layer;
   a post electrode formed on the second portion of the conductive member, wherein the post electrode has a top surface, a side surface and a bottom surface which is connected to the second portion of the conductive member, and wherein the top surface of the post electrode includes a concave portion therein;
   a sealing resin which seals the top surface of the semiconductor chip, a top surface of the first portion of the conductive member and the side surface of the post electrode, wherein the top surface of the post electrode is exposed from the sealing resin; and
   an external terminal which is located on the top surface of the post electrode, wherein a part of the external terminal is embedded in the concave portion of the post electrode,
   wherein a diameter of the concave portion is 10% to 50% of a diameter of the post electrode, and a depth of the concave portion is 20% to 70% of a height of the post electrode.

2. A semiconductor device comprising:
   a semiconductor chip which has a top surface, wherein the top surface includes an electrode pad;
   an insulating layer which is formed on the top surface of the semiconductor chip, wherein the insulating layer has an opening which exposes the electrode pad;
   a conductive member which includes a first portion and a second portion, wherein the first portion is connected to the electrode pad via the opening, and wherein the second portion is extended from the first portion and located on the insulating layer;
   a post electrode formed on the second portion of the conductive member, wherein the post electrode has a top surface, a side surface and a bottom surface which is connected to the second portion of the conductive member;
   a sealing resin which seals the top surface of the semiconductor chip, a top surface of the first portion of the conductive member and the side surface of the post electrode, wherein the top surface of the post electrode is exposed from the sealing resin, and wherein the top surface of the post electrode is recessed from a top surface of the sealing resin so that a concave recess portion is located over the top surface of the post electrode; and
   an external terminal which is located on the top surface of the post electrode, wherein a part of the external terminal is embedded in the concave recess portion,
   wherein the external terminal is post shaped and the post shaped external terminal includes an hourglass shaped portion.

3. A semiconductor device comprising:
   a semiconductor chip which has a top surface, wherein the top surface includes an electrode pad;
   an insulating layer which is formed on the top surface of the semiconductor chip, wherein the insulating layer has an opening which exposes the electrode pad;
   a conductive member which includes a first portion and a second portion, wherein the first portion is connected to the electrode pad via the opening, and wherein the second portion is extended from the first portion and located on the insulating layer;
   a post electrode formed on the second portion of the conductive member, wherein the post electrode has a top surface, a side surface and a bottom surface which is connected to the second portion of the conductive member;
   a sealing resin which seals the top surface of the semiconductor chip, a top surface of the first portion of the conductive member and the side surface of the post electrode, wherein the top surface of the post electrode is exposed from the sealing resin, and wherein the top surface of the post electrode is recessed from a top surface of the sealing resin so that a concave recess portion is located over the top surface of the post electrode; and
   an external terminal which is located on the top surface of the post electrode, wherein a part of the external terminal is embedded in the concave recess portion
   wherein the external terminal includes a core portion which includes plastic, and a solder layer which is formed on the core portion.

4. The semiconductor device of claim 3, wherein a metal layer is formed between the core portion and the solder layer, and wherein a melting point of the metal layer is higher than a melting point of the solder layer.

5. A semiconductor device comprising:
   a semiconductor chip which has a top surface, wherein the top surface includes an electrode pad;
   an insulating layer which is formed on the top surface of the semiconductor chip, wherein the insulating layer has an opening which exposes the electrode pad;
   a conductive member which includes a first portion and a second portion, wherein the first portion is connected to the electrode pad via the opening, and wherein the second portion is extended from the first portion and located on the insulating layer;

a post electrode formed on the second portion of the conductive member, wherein the post electrode has a top surface, a side surface and a bottom surface which is connected to the second portion of the conductive member, and wherein the top surface of the post electrode includes a concave portion therein;

a sealing resin which seals the top surface of the semiconductor chip, a top surface of the first portion of the conductive member and the side surface of the post electrode, wherein the top surface of the post electrode is exposed from the sealing resin; and an external terminal which is located on the top surface of the post electrode, wherein a part of the external terminal is embedded in the concave portion of the post electrode, wherein the external terminal is post shaped and the post shaped external terminal includes an hourglass shaped portion.

6. A semiconductor device comprising:

a semiconductor chip which has a top surface, wherein the top surface includes an electrode pad;

an insulating layer which is formed on the top surface of the semiconductor chip, wherein the insulating layer has an opening which exposes the electrode pad;

a conductive member which includes a first portion and a second portion, wherein the first portion is connected to the electrode pad via the opening, and wherein the second portion is extended from the first portion and located on the insulating layer;

a post electrode formed on the second portion of the conductive member, wherein the post electrode has a top surface, a side surface and a bottom surface which is connected to the second portion of the conductive member, and wherein the top surface of the post electrode includes a concave portion therein;

a sealing resin which seals the top surface of the semiconductor chip, a top surface of the first portion of the conductive member and the side surface of the post electrode, wherein the top surface of the post electrode is exposed from the sealing resin; and an external terminal which is located on the top surface of the post electrode, wherein a part of the external terminal is embedded in the concave portion of the post electrode, wherein the external terminal includes a core portion which includes plastic, and a solder layer which is formed on the core portion.

7. The semiconductor device of claim 6, wherein a metal layer is formed between the core portion and the solder layer, and wherein a melting point of the metal layer is higher than a melting point of the solder layer.

8. A semiconductor device comprising:

a semiconductor chip having a top surface and an electrode pad on the top surface;

a conductive member connected to the electrode pad and extending over the semiconductor chip;

a sealing resin on a top surface of the conductive member and over the semiconductor chip, the sealing resin having an opening over a portion of the top surface of the conductive member;

a post electrode in the opening of the sealing resin and on the portion of the top surface of the conductive member, a top surface of the post electrode recessed below a top surface of the sealing resin; and an external terminal extending into the opening of the sealing resin and on the top surface of the post electrode, wherein the external terminal is post shaped and the post shaped external terminal includes an hourglass shaped portion.

9. A semiconductor device comprising:

a semiconductor chip having a top surface and an electrode pad on the top surface;

a conductive member connected to the electrode pad and extending over the semiconductor chip;

a sealing resin on a top surface of the conductive member and over the semiconductor chip, the sealing resin having an opening over a portion of the top surface of the conductive member;

a post electrode in the opening of the sealing resin and on the portion of the top surface of the conductive member, a top surface of the post electrode recessed below a top surface of the sealing resin; and an external terminal extending into the opening of the sealing resin and on the top surface of the post electrode, wherein the external terminal includes a core portion which includes plastic, a metal layer on the core portion, and a solder layer on the metal layer, wherein a melting point of the metal layer is higher than a melting point of the solder layer.

* * * * *